(12) United States Patent
Song et al.

(10) Patent No.: US 9,379,058 B2
(45) Date of Patent: Jun. 28, 2016

(54) GROUNDING DUMMY GATE IN SCALED LAYOUT DESIGN

(71) Applicant: QUALCOMM Incorporated, San Diego, CA (US)

(72) Inventors: Stanley Seungchul Song, San Diego, CA (US); Zhongze Wang, San Diego, CA (US); Ohsang Kwon, San Diego, CA (US); Kern Rim, San Diego, CA (US); John Jianhong Zhu, San Diego, CA (US); Xiangdong Chen, Irvine, CA (US); Foua Vang, Lemon Grove, CA (US); Raymond George Stephany, Austin, TX (US); Choh Fei Yeap, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 14/274,184

(22) Filed: May 9, 2014

(65) Prior Publication Data
US 2015/0235948 A1    Aug. 20, 2015

Related U.S. Application Data

(60) Provisional application No. 61/940,011, filed on Feb. 14, 2014.

(51) Int. Cl.
| | |
|---|---|
| *H01L 29/423* | (2006.01) |
| *H01L 29/417* | (2006.01) |
| *H01L 23/528* | (2006.01) |
| *H01L 23/522* | (2006.01) |
| *H01L 27/088* | (2006.01) |
| *H01L 21/768* | (2006.01) |
| *H01L 27/118* | (2006.01) |

(52) U.S. Cl.
CPC ...... *H01L 23/5283* (2013.01); *H01L 21/76877* (2013.01); *H01L 23/5226* (2013.01); *H01L 27/088* (2013.01); *H01L 29/41775* (2013.01); *H01L 29/42312* (2013.01); *H01L 2027/11866* (2013.01)

(58) Field of Classification Search
CPC .................. H01L 29/42312; H01L 29/41775; H01L 2027/11866
See application file for complete search history.

(56) References Cited

U.S. PATENT DOCUMENTS

| | | | |
|---|---|---|---|
| 5,864,156 A | 1/1999 | Juengling | |
| 6,320,234 B1 * | 11/2001 | Karasawa et al. | 257/371 |
| 6,476,490 B1 | 11/2002 | Dennison | |
| 6,967,866 B2 | 11/2005 | Hirata et al. | |
| 7,525,173 B2 | 4/2009 | Yang et al. | |
| 8,299,544 B2 | 10/2012 | Abou-Khalil et al. | |

(Continued)

OTHER PUBLICATIONS

International Search Report and Written Opinion—PCT/US2015/010667—ISA/EPO—May 11, 2015.

*Primary Examiner* — Phat X Cao
(74) *Attorney, Agent, or Firm* — Seyfarth Shaw LLP

(57) ABSTRACT

A semiconductor device includes a gate and a first active contact adjacent to the gate. Such a device further includes a first stacked contact electrically coupled to the first active contact, including a first isolation layer on sidewalls electrically isolating the first stacked contact from the gate. The device also includes a first via electrically coupled to the gate and landing on the first stacked contact. The first via electrically couples the first stacked contact and the first active contact to the gate to ground the gate.

15 Claims, 13 Drawing Sheets

(56) References Cited

U.S. PATENT DOCUMENTS

| | | |
|---|---|---|
| 8,604,531 B2 | 12/2013 | Tu |
| 2004/0173912 A1 | 9/2004 | Rhodes |
| 2007/0145519 A1* | 6/2007 | Peng ............... H01L 21/76895 |
| | | 257/506 |
| 2011/0294292 A1* | 12/2011 | Adetutu et al. ............... 438/675 |
| 2012/0098073 A1* | 4/2012 | Yu ..................... H01L 21/76802 |
| | | 257/413 |
| 2012/0211837 A1 | 8/2012 | Baars et al. |
| 2013/0093020 A1 | 4/2013 | Zhu et al. |
| 2013/0119474 A1 | 5/2013 | Schultz |
| 2013/0248990 A1 | 9/2013 | Kim et al. |
| 2014/0035048 A1 | 2/2014 | Lee et al. |

* cited by examiner

GROUNDING DUMMY GATE IN SCALED LAYOUT DESIGN

CROSS REFERENCE TO RELATED APPLICATION

The present application claims the benefit of U.S. Provisional Patent Application No. 61/940,011 filed on Feb. 14, 2014, in the names of Stanley Seungchul Song et al., the disclosure of which is expressly incorporated by reference herein in its entirety.

BACKGROUND

1. Field

Aspects of the present disclosure relate to semiconductor devices, and more particularly to electrically grounding gates in a scaled layout design within an integrated circuit.

2. Background

Interconnect layers are often used to connect different devices together on an integrated circuit. As integrated circuits become more complex, more interconnect layers are needed to provide the electrical connections between devices. Further, as device geometries become smaller, it becomes more difficult to connect to the devices themselves.

SUMMARY

A semiconductor device in accordance with an aspect of the present disclosure includes a gate and a first active contact adjacent to the gate. Such a device further includes a first stacked contact electrically coupled to the first active contact, including a first isolation layer on sidewalls electrically isolating the first stacked contact from the gate. The device also includes a first via electrically coupled to the gate and landing on the first stacked contact. The first via electrically couples the first stacked contact and the first active contact to the gate to ground the gate.

A semiconductor device in accordance with another aspect of the present disclosure includes a gate and a first active contact adjacent to the gate. The device also includes an extended stacked contact electrically coupled to and partially overlapping the gate and the first active contact. The extended stacked contact is self-aligned with a neighbor stacked contact to electrically isolate the extended stacked contact from the neighbor stacked contact.

A semiconductor device in accordance with another aspect of the present disclosure includes a gate and a first active contact adjacent to the gate. The device also includes means for electrically coupling to the first active contact including means for isolating the electrical coupling means from the gate. The device also includes a first via electrically coupled to the gate and landing on the electrical coupling means. The first via electrically couples the electrical coupling means and the first active contact to the gate to ground the gate.

A semiconductor device in accordance with another aspect of the present disclosure includes a gate and a first active contact adjacent to the gate. The device also includes means for electrically coupling to and partially overlapping the gate and the first active contact. The coupling means is self-aligned with a neighbor stacked contact to electrically isolate the coupling means from the neighbor stacked contact.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1:
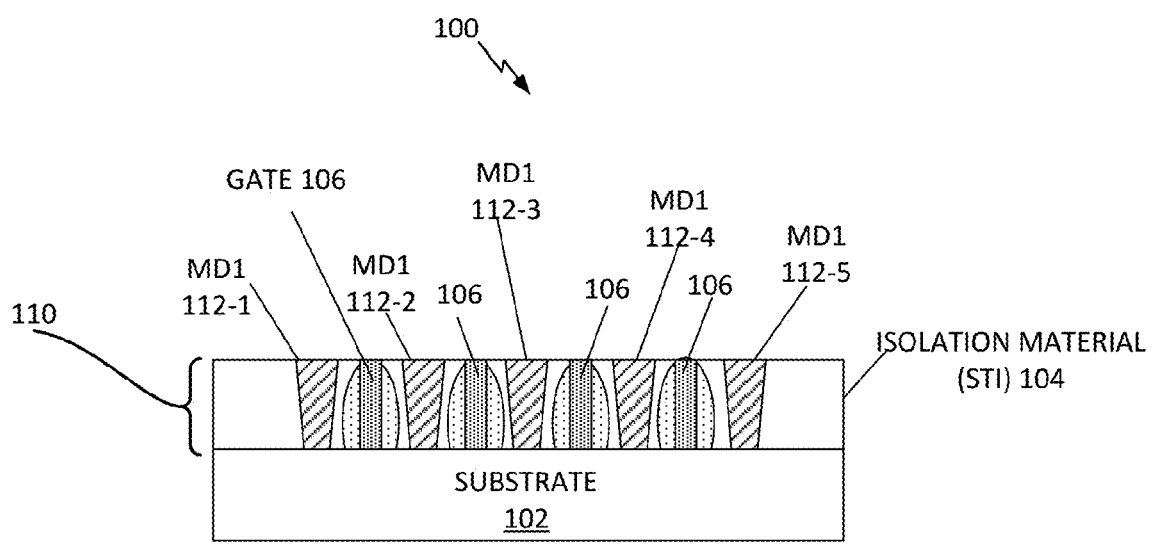
FIG. 1 illustrates a side view of an integrated circuit device including a middle of line interconnect layer.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts. As described herein, the use of the term "and/or" is intended to represent an "inclusive OR", and the use of the term "or" is intended to represent an "exclusive OR".

Semiconductor fabrication processes are often divided into three parts: a front end of line (FEOL), a middle of line (MOL) and a back end of line (BEOL). Front end of line processes include wafer preparation, isolation, well formation, gate patterning, spacers, and dopant implantation. A middle of line process includes gate and terminal contact formation. The gate and terminal contact formation of the middle of line process, however, is an increasingly challenging part of the fabrication flow, particularly for lithography patterning. Back end of line processes include forming interconnects and dielectric layers for coupling to the FEOL devices. These interconnects may be fabricated with a dual damascene process using plasma-enhanced chemical vapor deposition (PECVD) deposited interlayer dielectric (ILD) materials.

More recently, the number of interconnect levels for circuitry has substantially increased due to the large number of transistors that are now interconnected in a modern microprocessor. The increased number of interconnect levels for supporting the increased number of transistors involves more intricate middle of line processes to perform the gate and terminal contact formation.

As described herein, the middle of line interconnect layers may refer to the conductive interconnects for connecting a first conductive layer (e.g., metal 1 (M1)) to the oxide diffusion (OD) layer of an integrated circuit as well for connecting M1 to the active devices of the integrated circuit. The middle of line interconnect layers for connecting M1 to the OD layer of an integrated circuit may be referred to as "MD1" and "MD2." The middle of line interconnect layer for connecting M1 to the poly (conductive) gates of an integrated circuit may be referred to as "MP."

In some circuits, such as electrostatic discharge (ESD) or high speed devices, an extra gate, called a "dummy gate," is used to control the device. To prevent any floating bias voltage from activating the device, the dummy gate may be electrically coupled (tied) to ground. The dummy gate may be tied to the source of a neighbor FET device, which is known as a "dummy gate tie off scheme"

Another way to couple the dummy gate to ground is to terminate one side of the active area where the dummy gate is, which prevents the dummy gate from forming a drain contact. This is known as a "diffusion break approach." The diffusion break method typically uses two dummy gates, one dummy gate on each side of the broken active area.

One aspect of the present disclosure allows for small, scalable design-rule spacing between active contacts and a dummy gate by merging a gate contact (e.g., metal to poly (MP)) to a first stacked contact (e.g., metal to diffusion (MD) contact) that contacts a source contact in the neighboring device. By merging these two contacts, when the design rule scales down, the other neighboring MD1 active contacts are not affected. In related art schemes, however, the overlap of the gate to dummy gate contact overlaps the narrow space to the other neighboring MD1 active contacts, and results in difficult manufacturing or uses a larger layout area to provide space between the gates.

FIG. 1 shows a cross-sectional view illustrating an integrated circuit (IC) device 100 in which routing of conductive layers is performed within a middle of line (MOL) interconnect layer 110 according to one aspect of the disclosure. The IC device 100 includes a semiconductor substrate (e.g., a silicon wafer) 102 having shallow trench isolation (STI) regions (e.g., an isolation layer 104). Within the STI region and the substrate 102 is an active region in which active devices having a source region, a drain region, and a gate region (e.g., conductive gate 106) are formed.

In FIG. 1, the first MOL interconnect layer 110 includes a set of active (oxide diffusion (OD)) contacts, which are often referred to as metal diffusion (MD1) contacts, shown as MD1 112-1, 112-2, 112,3, 112-4, and 112-5 (collectively or generally referred to as MD1 112). The MD1 active contacts 112 are fabricated on the substrate 102 technology. The active contacts 112 may be coupled to the active devices (e.g., the source and drain regions). In this configuration, routing of the conductive layers may be performed to ground a dummy gate to one of the active contacts 112. The first MOL conductive layer may be composed of tungsten or other like conductive material.

Figure 2:
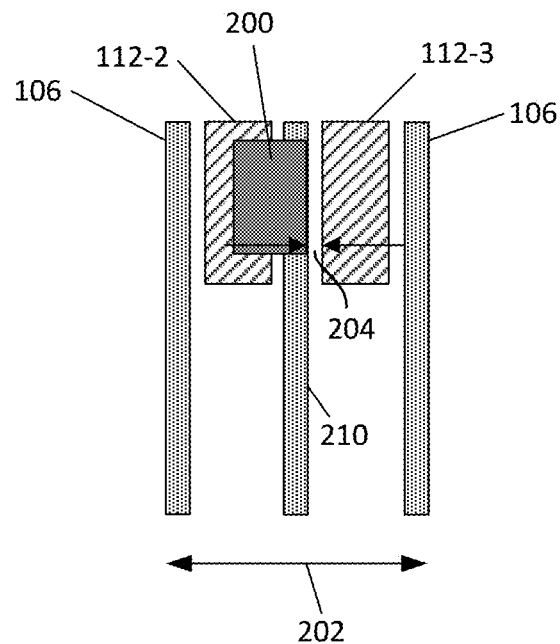
FIG. 2 illustrates a top view of a semiconductor device including a first gate tie off scheme within a middle of line interconnect layer.

FIG. 2 illustrates a top view of a semiconductor circuit including a first gate tie off scheme within a middle of line interconnect layer. Representatively, conductive gates 106 are interleaved with, for example the MD1 active contact 112-2 and the MD1 active contact 112-3. The configuration in FIG. 2 is sometimes referred to as a continuous OD (CNOD) scheme. In some circuits, one of the conductive gates 106 is connected as a gate, which may be referred to herein as a dummy gate 210, using a gate contact 200 (e.g., metal to poly (MP)). In small geometry circuitry, a distance 202 is designed to be at or near the limit of the design geometry constraints. In this arrangement, a distance 204 between the gate contact 200 and the MD1 active contact 112-3 may be insufficient to prevent shorting. In particular, when the spacing between gates becomes small, there is an increased risk that the gate contact 200 will electrically connect to more than the MD1 active contact 112. For example, when the distance 204 is too small, the gate contact 200 may connect to both the MD1 active contact 112-2 and the MD1 112-3 active contact.

Figure 3:
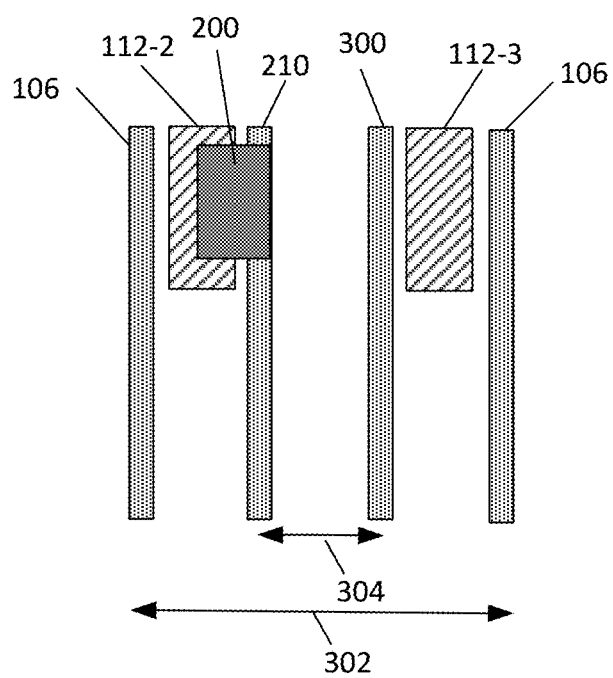
FIG. 3 illustrates a top view of a semiconductor device including a second gate tie off scheme within a middle of line interconnect layer.

FIG. 3 illustrates a top view of a semiconductor circuit including a second gate tie off scheme within a middle of line interconnect layer. In this arrangement, a diffusion break (non-continuous OD) scheme is provided in which the OD is interrupted or broken between neighboring devices. This allows for some misalignment between the gate contact 200 and the MD1 active contacts 112. The scheme shown in FIG. 3, however, uses an additional gate 300 that is added to the devices, which increases a distance 302 because of the additional space 304 between devices. The distance 302 limits the number of devices per unit area, which may be undesirable or not feasible for certain applications.

FIGS. 4-21 illustrate cross-sectional views of exemplary processing to provide a gate tie off scheme to electrically ground a dummy gate within a middle of line interconnect layer according to aspects of the present disclosure. Although a dummy gate is described, a functional gate could be substituted.

Figure 4:
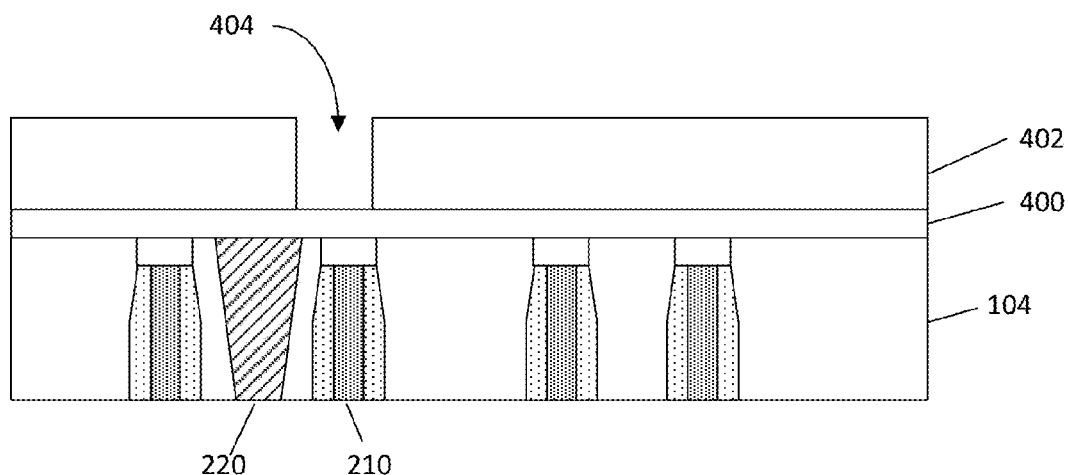
FIG. 4 illustrates a side view of a semiconductor device to show formation of a gate contact to provide a gate tie off scheme within a middle of line interconnect layer according to one aspect of the present disclosure.

FIG. 4 illustrates a side view of a semiconductor device to show formation of a gate contact 810 (FIG. 9) to provide the gate tie off scheme within the middle of line interconnect layer according to one aspect of the present disclosure. Representatively, a first active contact 220 (e.g., MD1 112) is shown with a dummy gate 210 as a neighbor. A hard mask 400 is formed on a surface of the isolation layer 104. In addition, a photoresist layer 402 is formed on the hard mask 400. The photoresist layer 402 is then patterned according to a pattern 404.

Figure 5:
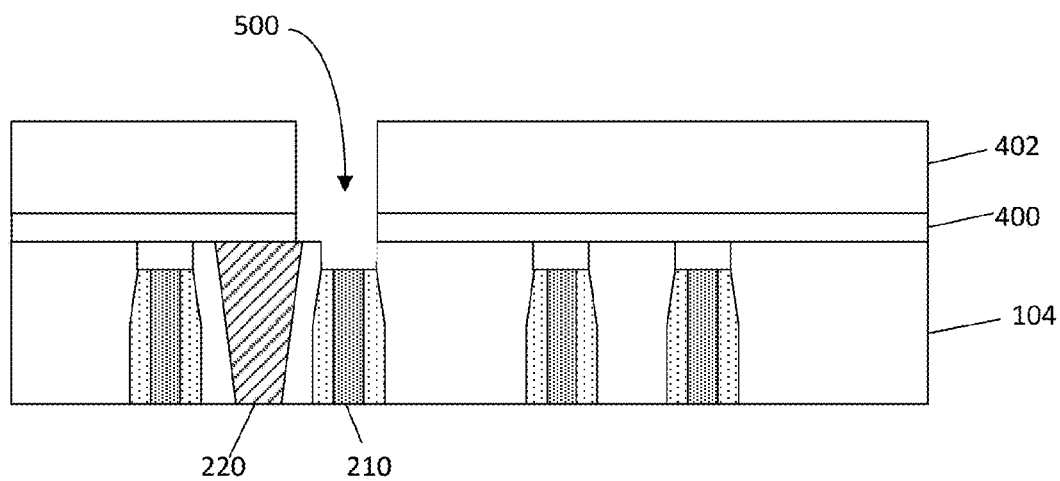
FIG. 5 illustrates a side view of the semiconductor device of FIG. 4 to show formation of the gate contact to provide the gate tie off scheme within the middle of line interconnect layer according to one aspect of the present disclosure.
Figure 9:
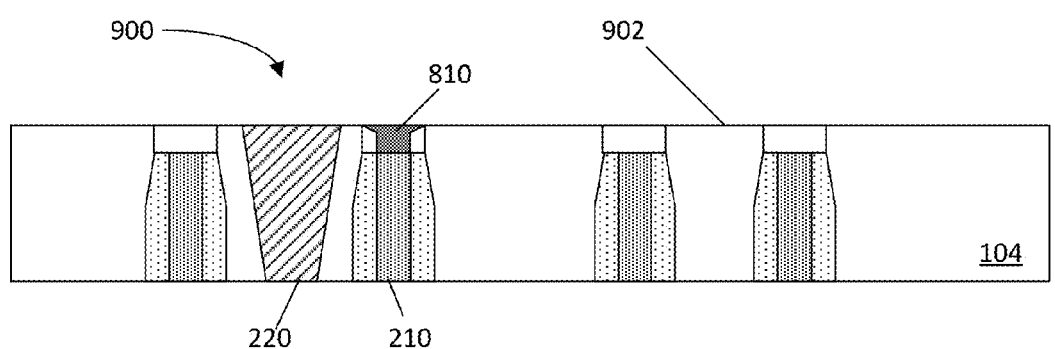
FIG. 9 illustrates a side view of the semiconductor device of FIG. 8 including the gate contact to provide the gate tie off scheme within the middle of line interconnect layer according to one aspect of the present disclosure.

FIG. 5 illustrates a side view of the semiconductor device of FIG. 4 to show formation of the gate contact 810 (FIG. 9) to provide the gate tie off scheme within the middle of line interconnect layer according to one aspect of the present disclosure. Representatively, an etch 500 of a hard mask 400 is shown. This etching exposes the dummy gate 210 as well as a portion of the first active contact 220. The etch of the hard mask 400 is performed to enable formation of the gate contact 810, as shown in FIG. 9. In another aspect of the present disclosure, a via may directly land on the dummy gate 210 without the gate contact 810.

Figure 6:
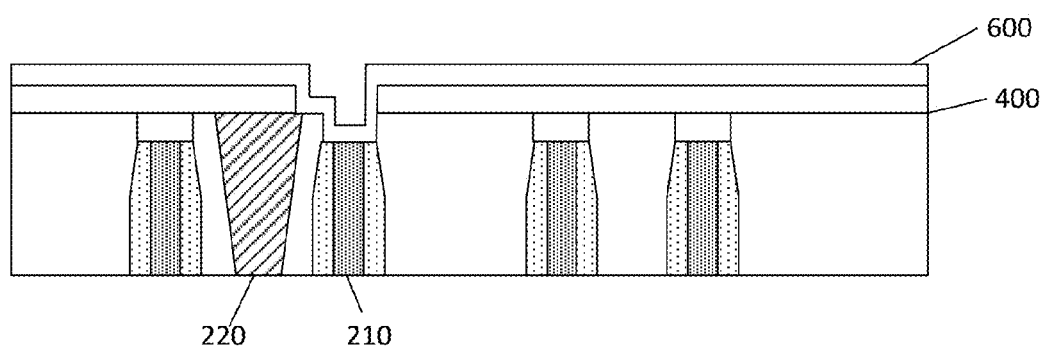
FIG. 6 illustrates a side view of the semiconductor device of FIG. 5 to show formation of the gate contact to provide the gate tie off scheme within the middle of line interconnect layer according to one aspect of the present disclosure.

FIG. 6 illustrates a side view of the semiconductor device of FIG. 5 to show formation of the gate contact 810 (FIG. 9) to provide the gate tie off scheme within the middle of line interconnect layer according to one aspect of the present disclosure. This arrangement illustrates removal of the photoresist layer 402. Once removed, a liner material is deposited on the hard mask 400 to form a liner 600, which may be a self-aligned liner. In this configuration, the liner 600 is disposed on the hard mask 400 and within the opening that exposes the dummy gate 210. This liner 600 may ensure that there is no electrical contact to the first active contact 220 neighboring the dummy gate 210.

Figure 7:
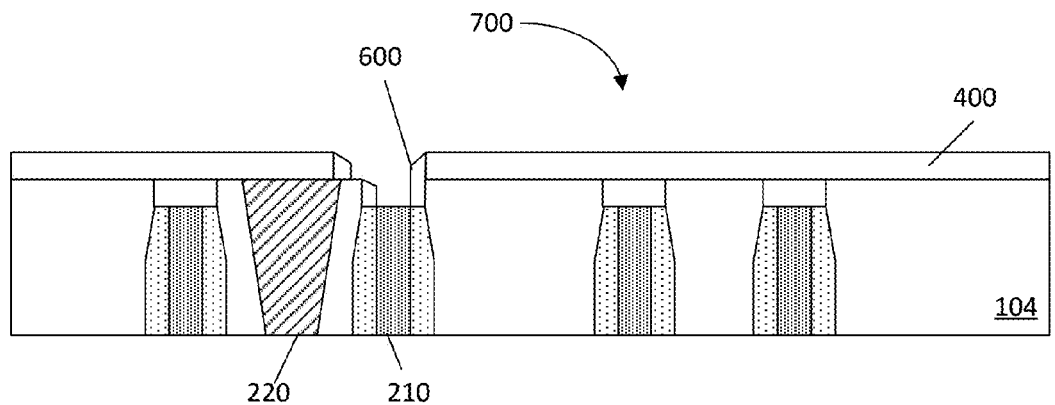
FIG. 7 illustrates a side view of the semiconductor device of FIG. 6 to show formation of the gate contact to provide the gate tie off scheme within the middle of line interconnect layer according to one aspect of the present disclosure.

FIG. 7 illustrates a side view of the semiconductor device of FIG. 6 to show formation of the gate contact 810 (FIG. 9) to provide the gate tie off scheme within the middle of line interconnect layer according to one aspect of the present disclosure. Representatively, an etch 700 removes the liner 600 from the hard mask 400. The etch 700 may be an isotropic etch, in that the liner 600 remains within the opening exposing the dummy gate 210, to provide a spacer for the opening exposing the dummy gate 210. In this arrangement, the liner 600 provides a spacer to enable grounding of the dummy gate 210 to the first active contact 220 at a middle of line interconnect layer.

Figure 8:
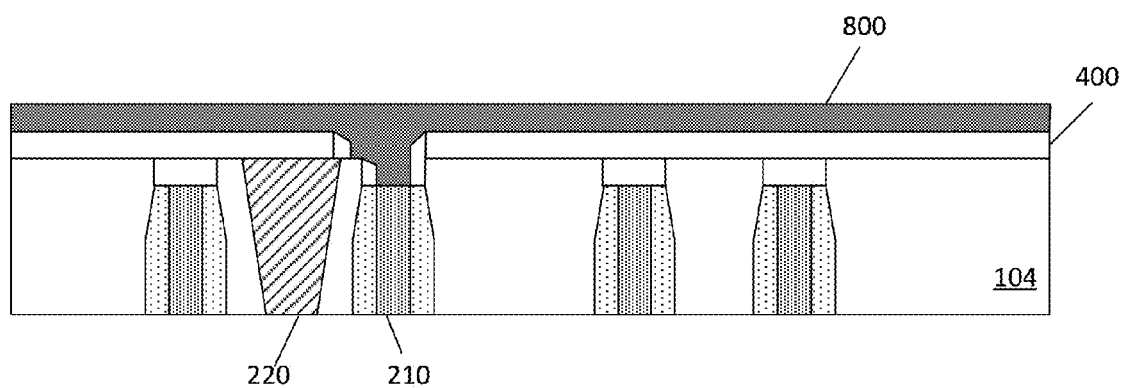
FIG. 8 illustrates a side view of the semiconductor device of FIG. 7 to show formation of the gate contact to provide the gate tie off scheme within the middle of line interconnect layer according to one aspect of the present disclosure.

FIG. 8 illustrates a side view of the semiconductor device of FIG. 7 to show formation of the gate contact 810 (FIG. 9) to provide the gate tie off scheme within the middle of line interconnect layer according to one aspect of the present disclosure. In this arrangement, a conductive material is deposited on the hard mask 400 and within the opening exposing the dummy gate 210 to form a conductive layer 800. The conductive layer 800, which may be tungsten, copper, or another conductive material that is coupled to the hard mask 400, the liner 600 and the dummy gate 210.

FIG. 9 illustrates a side view of the semiconductor device of FIG. 8 including the gate contact 810 to provide the gate tie off scheme within the middle of line interconnect layer according to one aspect of the present disclosure. Representatively, an etch 900 is performed to remove the conductive layer 800. In addition, the etch 900 may planarize the surface 902 of the isolation layer 104 with the conductive layer 800. In this configuration, the etch forms a gate contact 810 that is self-aligned with the first active contact 220. In this configuration, the liner 600 is on opposing sidewalls of the gate contact 810. The etch may be performed by using a chemical-mechanical planarization (CMP).

Figure 10:
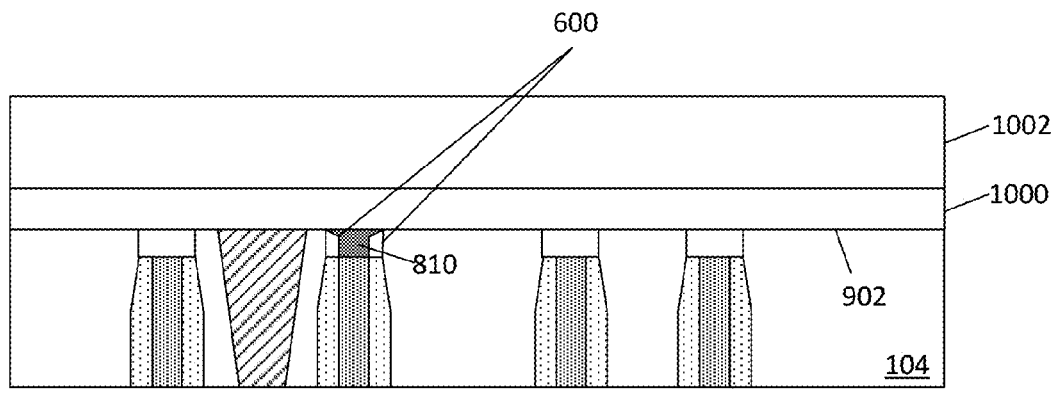
FIG. 10 illustrates a side view of the semiconductor device of FIG. 9 to show formation of a stacked contact to provide the gate tie off scheme within the middle of line interconnect layer according to one aspect of the present disclosure.

FIG. 10 illustrates a side view of the semiconductor device of FIG. 9 to show formation of a first stacked contact 1310 (FIG. 14) to provide the gate tie off scheme within the middle of line interconnect layer according to one aspect of the present disclosure. In this arrangement, a hard mask 1000 is formed on the surface 902 of the isolation layer 104. In addition, a dielectric layer 1002 is deposited on the hard mask 1000.

Figure 11:
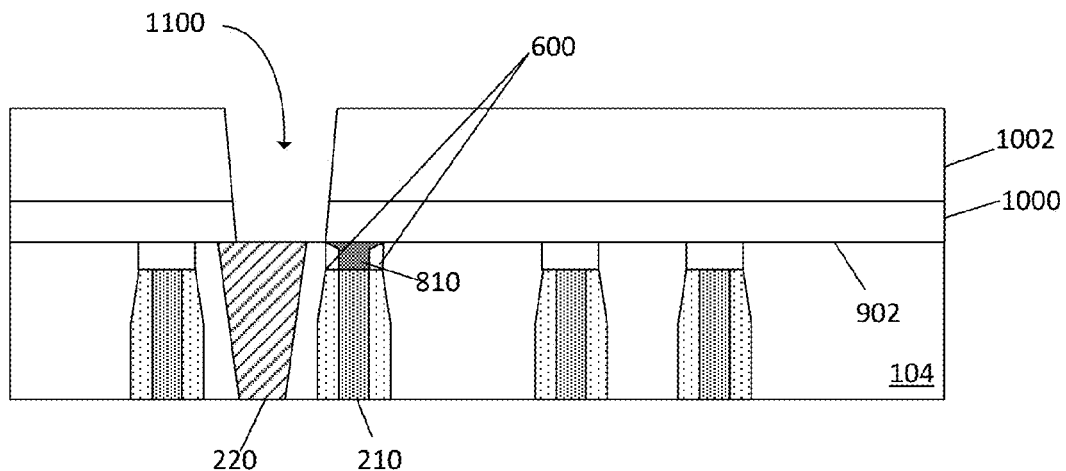
FIG. 11 illustrates a side view of the semiconductor device of FIG. 10 to show formation of the stacked contact to provide the gate tie off scheme within the middle of line interconnect layer according to one aspect of the present disclosure.
Figure 14:
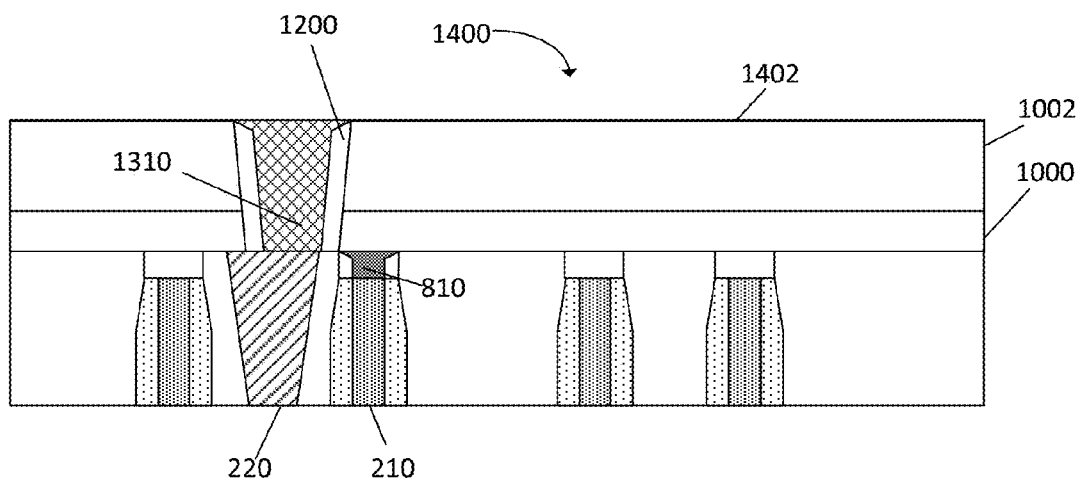
FIG. 14 illustrates a side view of the semiconductor device of FIG. 13 to show formation of the stacked contact of the gate tie off scheme within the middle of line interconnect layer according to one aspect of the present disclosure.

FIG. 11 illustrates a side view of the semiconductor device of FIG. 10 to show formation of the first stacked contact 1310 (FIG. 14) to provide the gate tie off scheme within the middle of line interconnect layer according to one aspect of the present disclosure. Representatively, the dielectric layer 1002 is patterned to define the first stacked contact 1310 (FIG. 14). In particular, an etch is then performed to selectively remove the dielectric layer 1002 and the hard mask 1000 forming an opening 1100. The opening 1100 exposes the first active contact 220 at the surface 902 of the isolation layer 104. In this configuration, the opening 1100 is offset from the first active contact 220. The liner 600 provides some flexibility in processing, as well as some misalignment, such that electrical coupling between the dummy gate 210 and the first active contact 220 may be avoided, if desired.

Figure 12:
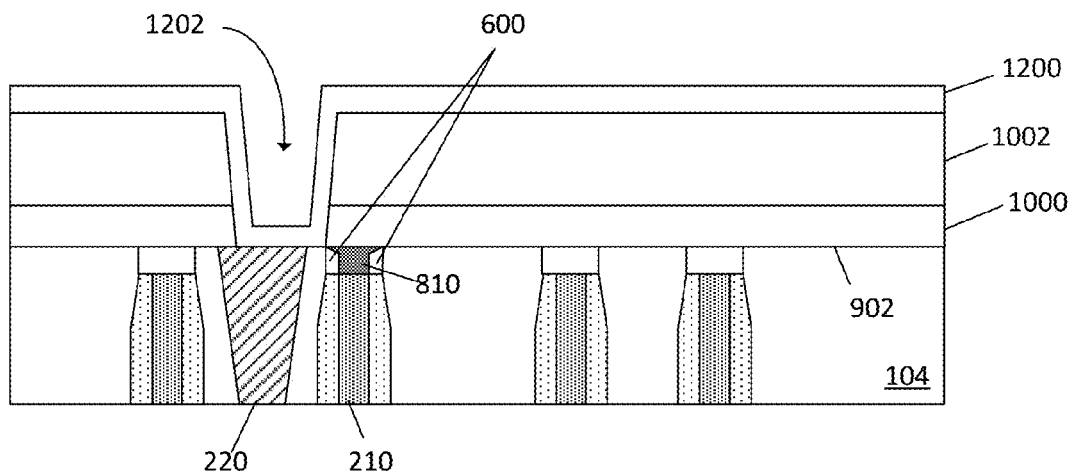
FIG. 12 illustrates a side view of the semiconductor device of FIG. 11 to show formation of the stacked contact to provide the gate tie off scheme within the middle of line interconnect layer according to one aspect of the present disclosure.

FIG. 12 illustrates a side view of the semiconductor device of FIG. 11 to show formation of the first stacked contact 1310 (FIG. 14) to provide the gate tie off scheme within the middle of line interconnect layer according to one aspect of the present disclosure. In this arrangement, a liner 1200 is deposited on the dielectric layer and within the opening 1100 to provide a stacked contact opening 1202. The liner 1200 may be a self-aligning liner to the dielectric layer 1002. In this arrangement, the liner 1200 of the first stacked contact 1310 may be self-aligned to the liner 600 and or the gate contact 810. In another aspect of the present disclosure, the gate contact 810 is eliminated to enable a via landing on the dummy gate 210 and on the active contact 220.

Figure 13:
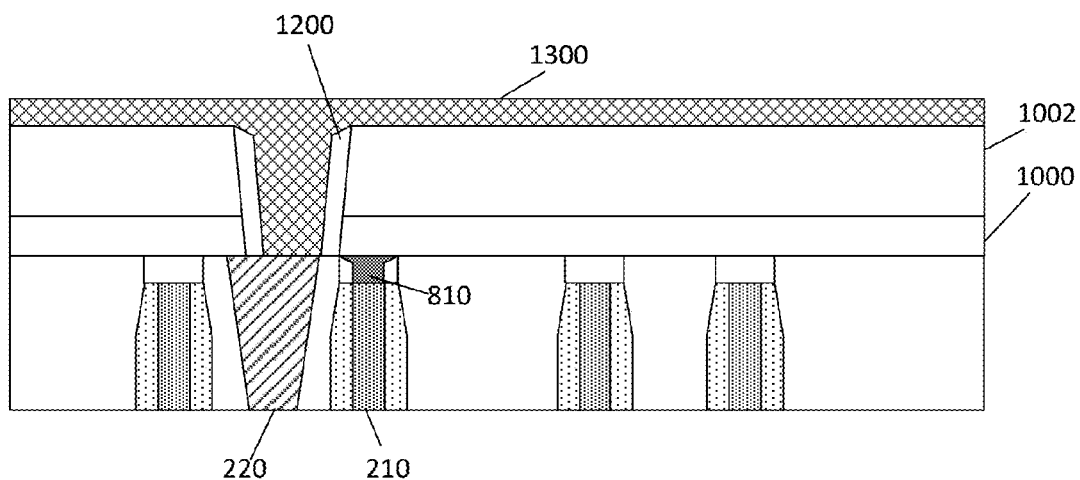
FIG. 13 illustrates a side view of the semiconductor device of FIG. 12 to show formation of the stacked contact to provide the gate tie off scheme within the middle of line interconnect layer according to one aspect of the present disclosure.

FIG. 13 illustrates a side view of the semiconductor device of FIG. 12 to show formation of the first stacked contact 1310 (FIG. 14) to provide the gate tie off scheme within the middle of line interconnect layer according to one aspect of the present disclosure. Representatively, an etching of the liner 1200 on the dielectric layer 1002 is performed. Once completed, a conductive material 1300 is deposited on the dielectric layer 1002 and within the stacked contact opening 1202. In this configuration, the liner 1200 is self-aligned with at least an edge of the gate contact 810. As a result, the liner 1200 provides additional electrical insulation between the first active contact 220 and the dummy gate 210, if desired.

FIG. 14 illustrates a side view of the semiconductor device of FIG. 13 to show formation of the first stacked contact 1310 of the gate tie off scheme within the middle of line interconnect layer according to one aspect of the present disclosure. In this arrangement, an etch 1400 is performed to selectively remove the conductive material 1300 from surface 1402 of the dielectric layer 1002. The etch 1400 may be a chemical mechanical planarization (CMP). The etch 1400 may also planarize the surface 1402 with the surface of the conductive material 1300 to form the first stacked contact 1310. In this configuration, the liner 1200 is on sidewalls of the first stacked contact 1310 and self-aligned to at least an edge of the liner of the gate contact 810.

Figure 15:
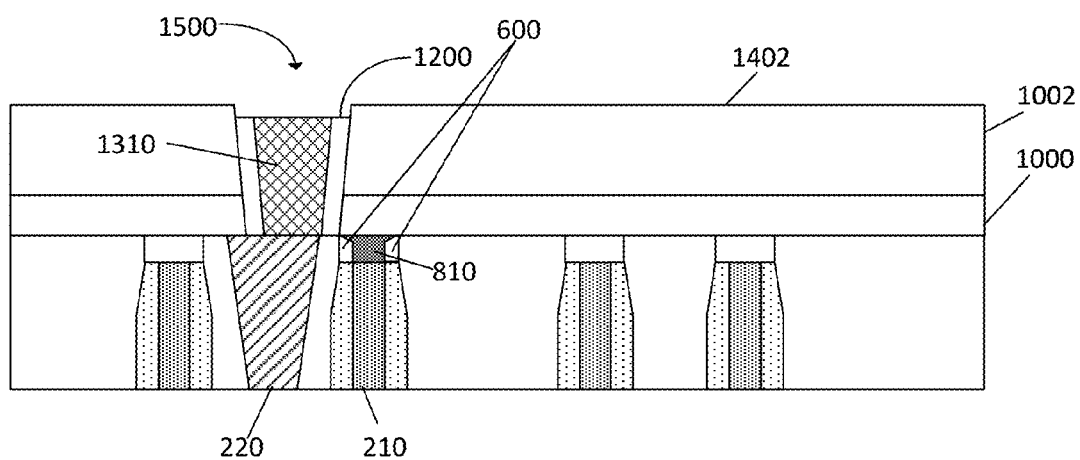
FIG. 15 illustrates a side view of the semiconductor device of FIG. 14 to show formation of the stacked contact of the gate tie off scheme within the middle of line interconnect layer according to one aspect of the present disclosure.

FIG. 15 illustrates a side view of the semiconductor device of FIG. 14 to show formation of the first stacked contact 1310 of the gate tie off scheme within the middle of line interconnect layer according to one aspect of the present disclosure. Representatively, an etch 1500 of the first stacked contact is performed. In this configuration, the etch 1500 recesses the level of the conductive material 1300 and the liner 1200 of the first stacked contact 1310 away from the surface 1402 of the dielectric layer 1002.

Figure 16:
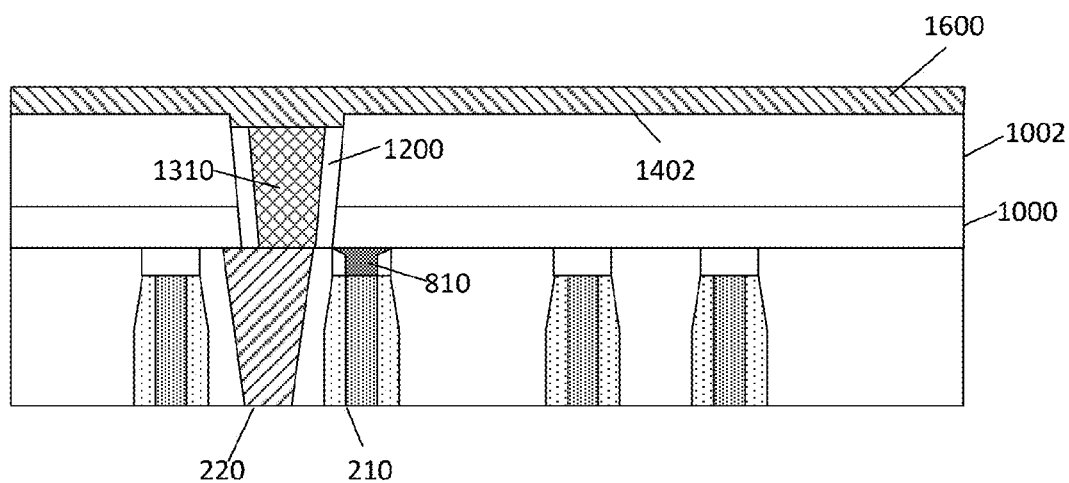
FIG. 16 illustrates a side view of the semiconductor device of FIG. 15 to show formation of the stacked contact of the gate tie off scheme within the middle of line interconnect layer according to one aspect of the present disclosure.

FIG. 16 illustrates a side view of the semiconductor device of FIG. 15 to show formation of the first stacked contact 1310 of the gate tie off scheme within the middle of line interconnect layer according to one aspect of the present disclosure. Representatively, a liner 1600 is formed on the surface 1402 of the dielectric layer 1002. The liner 1600 is also formed on the recessed portion of the conductive material 1300 and the liner 1200. In this arrangement, the liner 1600 provides a recessed spacer layer on the first stacked contact 1310.

Figure 17:
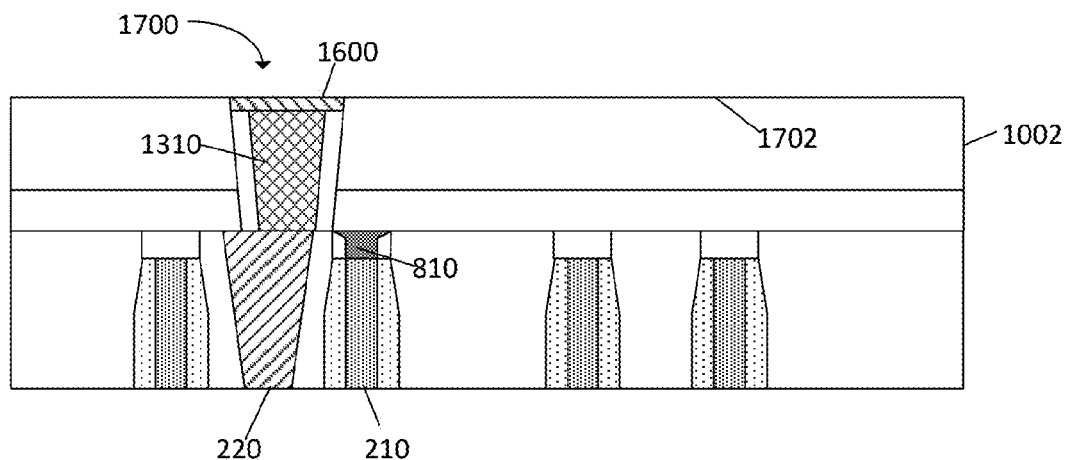
FIG. 17 illustrates a side view of the semiconductor device of FIG. 16 to provide the stacked contact of the gate tie off scheme within the middle of line interconnect layer according to one aspect of the present disclosure.

FIG. 17 illustrates a side view of the semiconductor device of FIG. 16 to provide the first stacked contact 1310 of the gate tie off scheme within the middle of line interconnect layer according to one aspect of the present disclosure. In this arrangement, an etch 1700 of the liner 1600 is performed to expose a surface 1702. The surface 1702 may be at the same level as the surface 1402 of the dielectric layer 1002, but may also be at a different level within the dielectric layer 1002, if desired. In this configuration, the first stacked contact 1310 includes the liner 1600 to provide a cap layer or other like protective layer.

Figure 18:
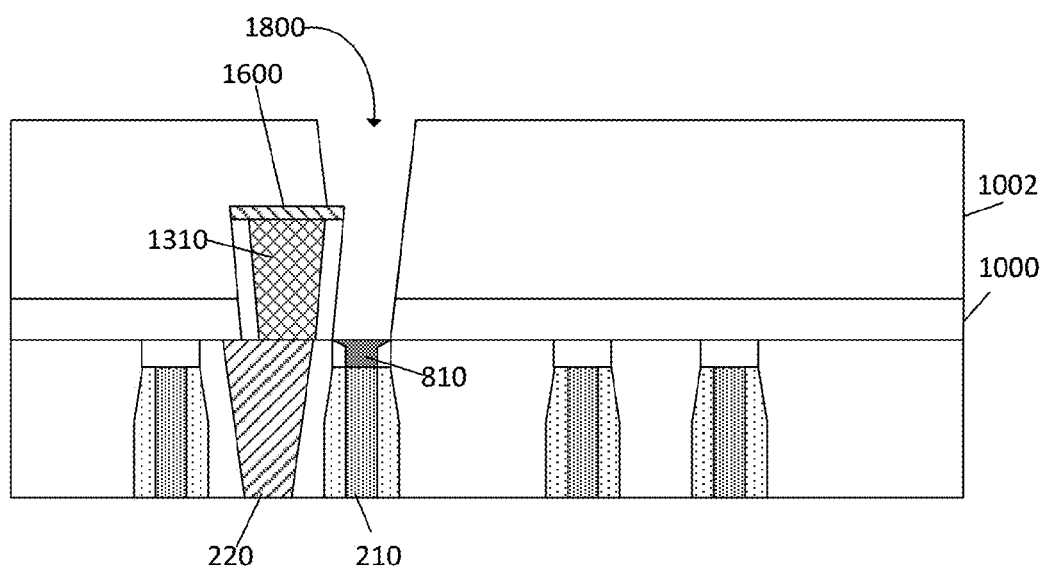
FIG. 18 illustrates a side view of the semiconductor device of FIG. 17 to show formation of a via to provide the gate tie off scheme within the middle of line interconnect layer according to one aspect of the present disclosure.

FIG. 18 illustrates a side view of the semiconductor device of FIG. 17 to show formation of a via 2000 (FIG. 20) to provide the gate tie off scheme within the middle of line interconnect layer according to one aspect of the present disclosure. Representatively, an additional growth of the dielectric layer 1002 is shown. An etching of the dielectric layer 1002 is also performed. The pattern used in etching the dielectric layer 1002 may be self-aligned to the etch used to form the opening 1100, including the liner 1200 (as a spacer) and the conductive material 1300. Etching of the dielectric layer 1002 and the hard mask 1000 to form the first opening 1800 exposes the gate contact 810, and may expose a portion of the liner 1600 if desired. In another configuration, the etching may expose the dummy gate 210 when the gate contact is eliminated to enable the via 2000 to land directly on the dummy gate 210.

Figure 19:
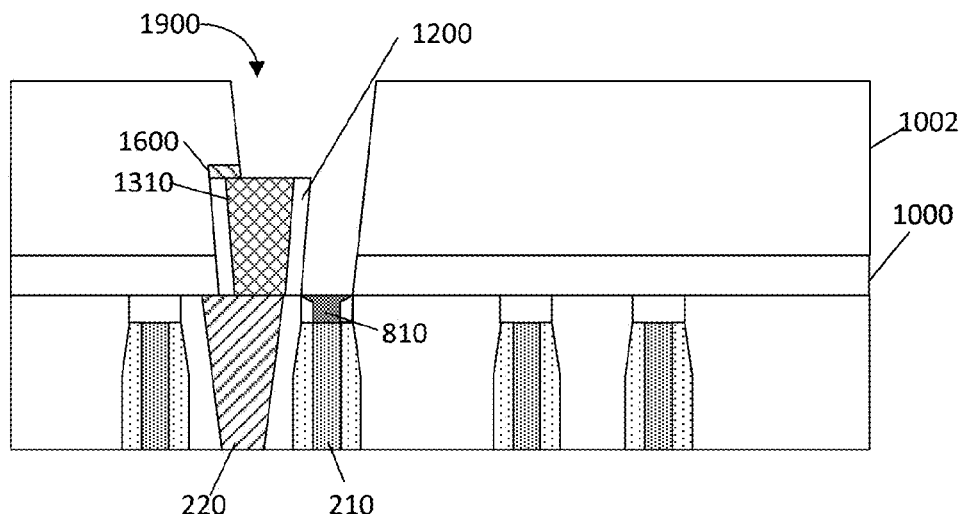
FIG. 19 illustrates a side view of the semiconductor device of FIG. 18 to show formation of the via to provide the gate tie off scheme within the middle of line interconnect layer according to one aspect of the present disclosure.

FIG. 19 illustrates a side view of the semiconductor device of FIG. 18 to show formation of the via 2000 to provide the gate tie off scheme within the middle of line interconnect layer according to one aspect of the present disclosure. In this arrangement, an etch removes an additional portion of the dielectric layer 1002 and a portion of the liner 1600 to form the first opening 1800. A subsequent etch forms a second opening 1900 that exposes the first stacked contact 1310. As noted, the subsequent etch may be performed to directly expose the dummy gate 210.

Figure 20:
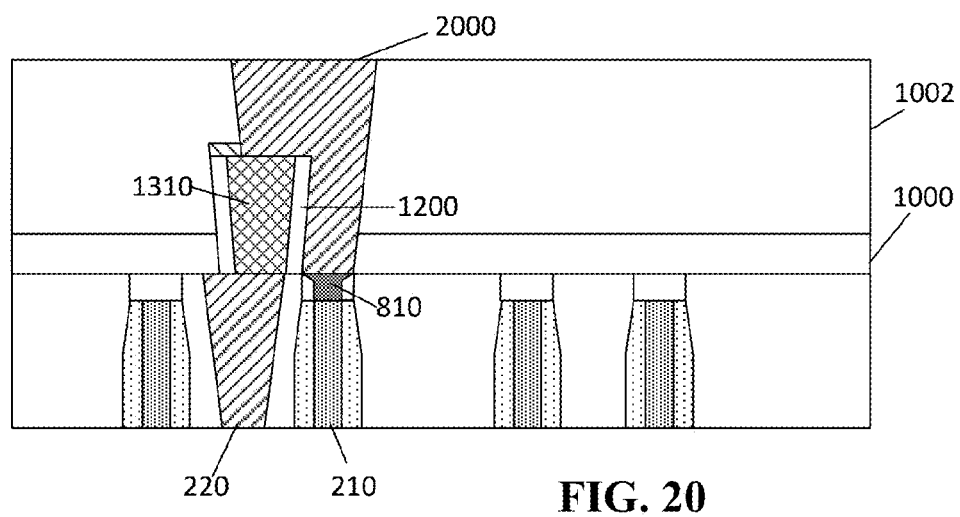
FIG. 20 illustrates a side view of the semiconductor device of FIG. 19 to show formation of a via to provide the gate tie off scheme within the middle of line interconnect layer according to one aspect of the present disclosure.

FIG. 20 illustrates a side view of the semiconductor device of FIG. 19 to show formation of a via 2000 to provide the gate tie off scheme within the middle of line interconnect layer according to one aspect of the present disclosure. In this arrangement formation of the via 2000 by filling the first opening 1800 and the second opening 1900 with a conductive material. The conductive material is deposited on the first stacked contact 1310 and on the gate contact 810 to form the via 2000. This electrically couples the first active contact 220 and the dummy gate 210 by joining the first stacked contact 1310 and the gate contact 810 with the via 2000. In another configuration, the via 2000 electrically couples the first active contact 220 and the dummy gate 210 by landing on both the first stacked contact 1310 and the dummy gate 210 without the gate contact 810 (i.e., no gate contact is provided).

Figure 21:
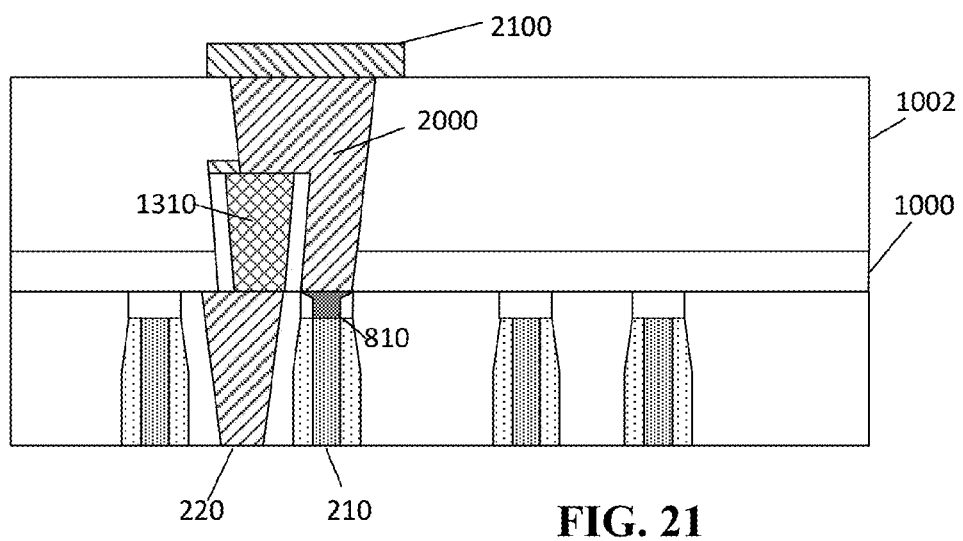
FIG. 21 illustrates a side view of the semiconductor device of FIG. 20 to show the via to provide the gate tie off scheme within the middle of line interconnect layer according to one aspect of the present disclosure.

FIG. 21 illustrates a side view of the semiconductor device of FIG. 20 to show the via 2000 to provide the gate tie off scheme within the middle of line interconnect layer according to one aspect of the present disclosure. Representatively, deposition of a capping layer 2100 on the via 2000 and a surface of the dielectric layer 1002 is performed. If desired, etching may stop before removing the liner 1600, which would have electrically isolated the first active contact 220 and the dummy gate 210.

One aspect of the present disclosure allows for small, scalable design-rule spacing between the MD1 active contacts 112 and the dummy gate 210 by merging the gate contact 810 (e.g., metal to poly (MP)) to the first stacked contact 1310 (e.g., metal to diffusion (MD) contact), which contacts the neighboring device. By merging these two contacts, when the design rule scales down, the other neighboring MD1 active contacts 112 are not affected. In related art schemes, however, the overlap of the gate to dummy gate contact overlaps the narrow space to the other neighboring MD1 active contacts 112, and results in difficult manufacturing or uses a larger layout area to provide space between the gates.

FIGS. 22A-23B illustrate cross-sectional views of semiconductor devices that provide gate tie off schemes to electrically ground a dummy gate within the middle of line interconnect layer according to aspects of the present disclosure.

Figure 22A:
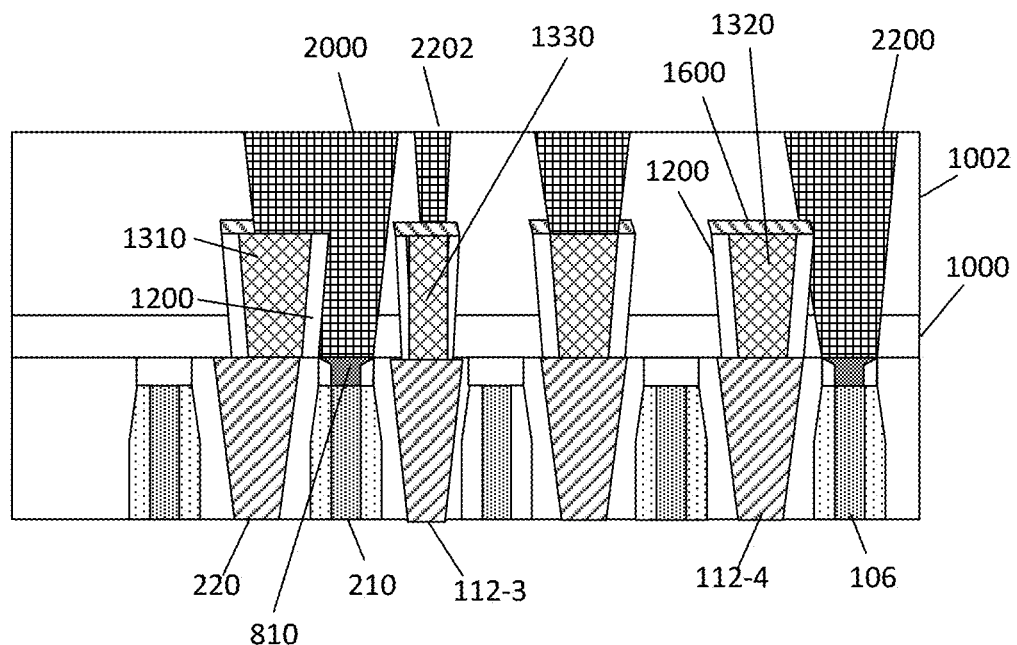
FIGS. 22A-22B illustrate cross-sectional and top views of a semiconductor device including the gate tie off scheme to electrically ground a dummy gate within the middle of line interconnect layer according to one aspect of the present disclosure.
Figure 22B:
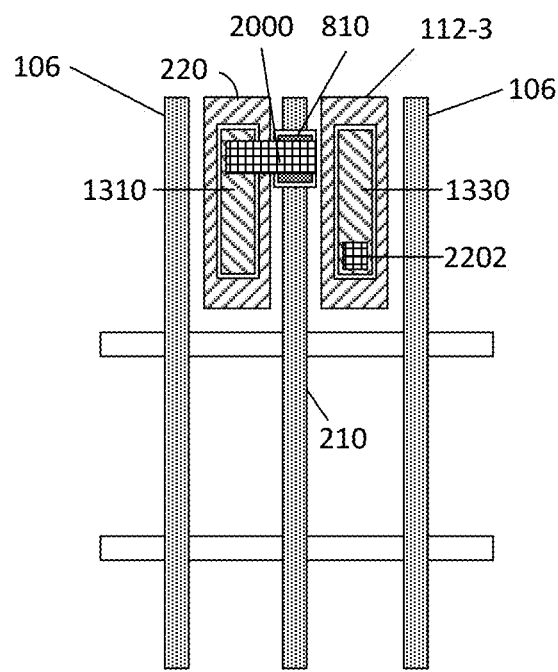

FIGS. 22A-22B illustrate cross sectional and top views of a semiconductor device including the gate tie off scheme to electrically ground the dummy gate 210. As shown in FIG. 22A, a via 2200 couples to the conductive gate 106, and allows for external or interconnection coupling to the via 2200. The via 2200 is electrically isolated from a second stacked contact 1320 because of the liner 1600 on the surface of the second stacked contact 1320. The via 2200 is also isolated from the MD1 active contact 112-4 because the via 2200 is self-aligned to the liner 1600 and the second stacked contact 1320. The liner 1200 on the sidewalls of the second stacked contact 1320 also electrically isolates the via 2200 from the second stacked contact 1320, as shown in the top view of FIG. 22B.

Referring again to FIG. 22A, another via 2202 couples to the MD1 active contact 112-3 through a third stacked contact 1330. Because the via 2202 is self-aligned to the third stacked contact 1330, the via 2202 is electrically isolated from other connections. A via 2000 couples the first active contact 220 to the dummy gate 210 by coupling a portion of the first stacked contact 1310 to the gate contact 810 of the dummy gate 210, as described in FIGS. 4-21.

In another aspect of the present disclosure, the via 2000 may be formed before the etching of the liner 1600. The liner 1600 may also electrically isolate the first active contact 220 from the gate contact 810 of the dummy gate 210. Because another MD1 112 active contact could be placed as another neighbor to the dummy gate 210, it is possible to connect the dummy gate 210 to the first active contact 220 while isolating the dummy gate 210 from another neighboring active contact 220. In this arrangement, the via 2000 is self-aligned with a neighboring active contact 220.

Figure 23A:
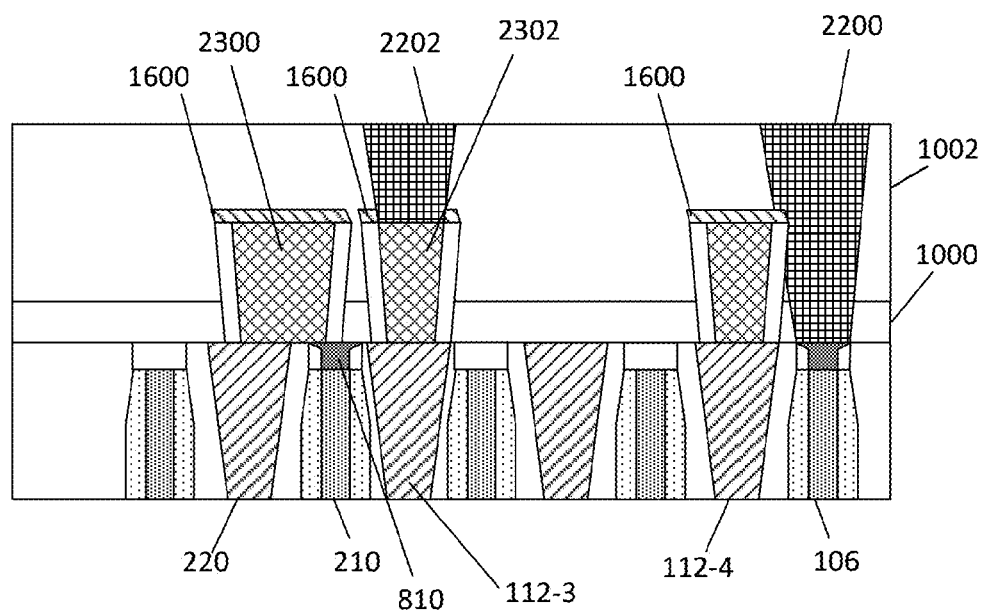
FIGS. 23A-23B illustrate cross-sectional and top views of a semiconductor device including a gate tie off scheme to electrically ground a dummy gate within a middle of line interconnect layer according to another aspect of the present disclosure.
Figure 23B:
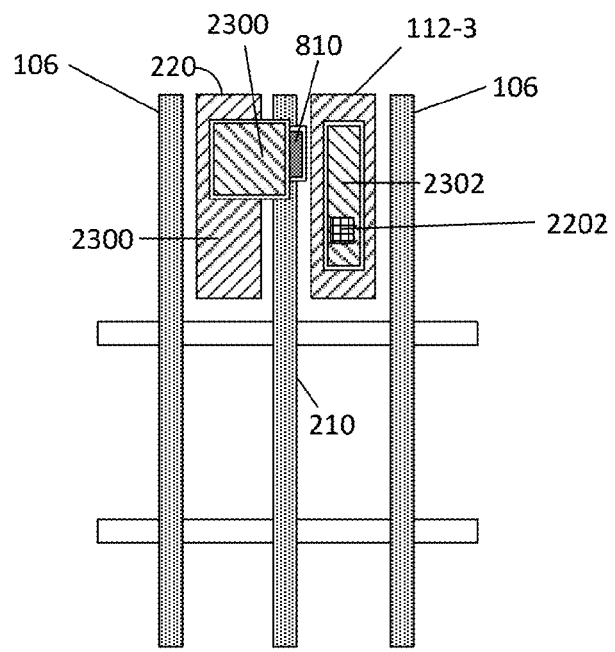

FIGS. 23A-23B illustrate cross-sectional and top views of a semiconductor device including a gate tie off scheme to electrically ground a dummy gate 210 within a middle of line interconnect layer according to another aspect of the present disclosure. As shown in FIG. 23A, the via 2200 and the via 2202 are similar to those described in FIGS. 22A and 22B. An extended stacked contact 2300, however, may couple the first active contact 220 to the gate contact 810 to electrically ground the dummy gate 210. Because the extended stacked contact 2300 is formed using the same mask as an adjacent stacked contact 2302, the extended stacked contact 2300 is electrically isolated from the adjacent stacked contact 2302. This allows for connection of the first active contact 220 and the dummy gate 210 at a different level of interconnection within the device. Further, because the extended stacked contact 2300 and the adjacent stacked contact 2302 are self-isolated, a tight design rule can be used to form the extended stacked contact 2300. In normal process windows, the extended stacked contact 2300 often will not connect to gate contact 810 of the dummy gate 210.

Figure 24:
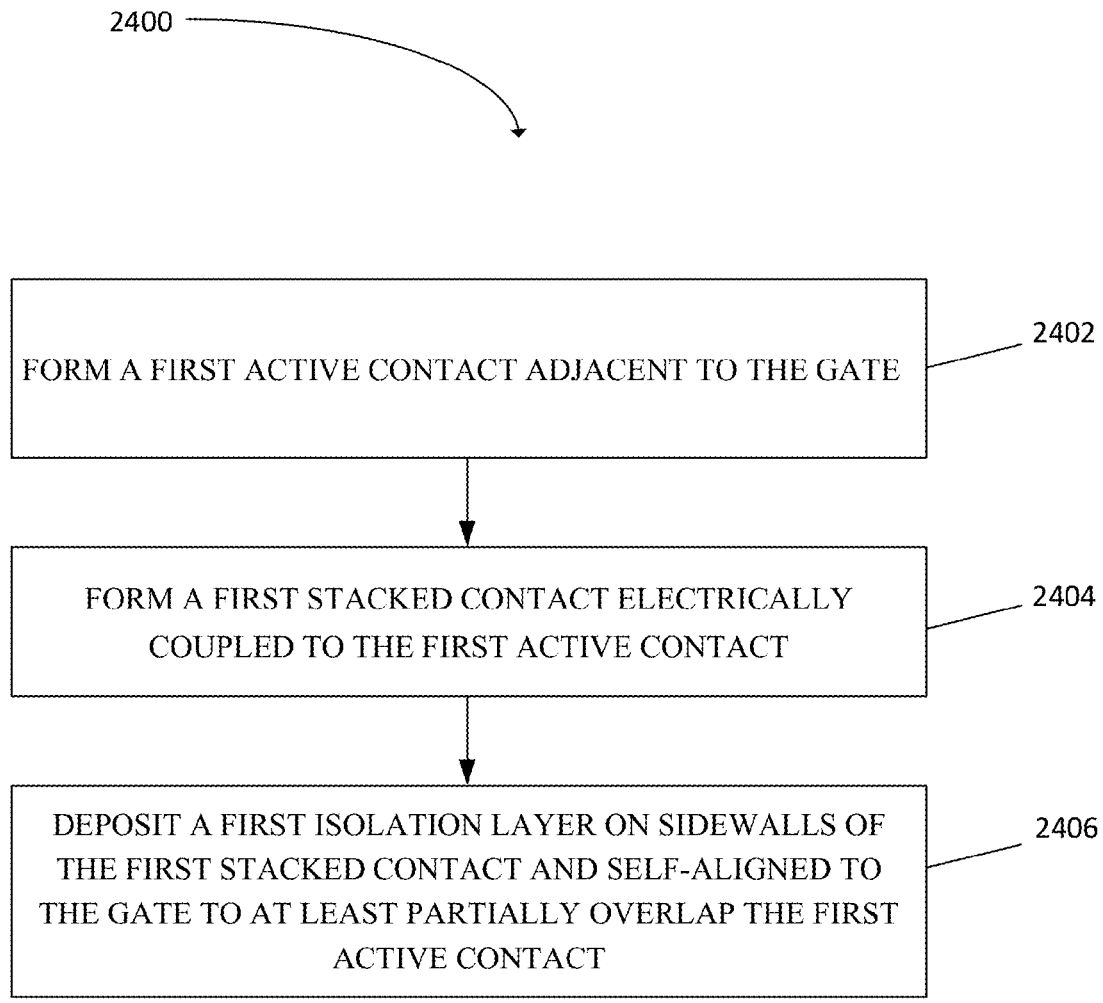
FIG. 24 is a process flow diagram illustrating electrical grounding of a dummy gate according to one aspect of the present disclosure.

FIG. 24 is a process flow diagram illustrating a method 2400 for grounding a gate in a device active area is illustrated. In block 2402, a first active contact adjacent to the gate is formed. For example, as shown in FIGS. 4 to 6, the first active contact 220 is adjacent to the dummy gate 210. In block 2404, a first stacked contact electrically coupled to the first active contact is formed. For example, as shown in FIGS. 13 to 15, the first stacked contact 1310 is coupled to the first active contact 220. In block 2406, a first isolation layer is deposited on sidewalls of the first stacked contact and self-aligned to the gate to at least partially overlap the first active contact. The electrical isolation may be provided by the liner 1200 that is on the sidewalls of the first stacked contact 1310.

According to a further aspect of the present disclosure, a semiconductor device is described. The device includes a gate and a first active contact adjacent to the gate. The device also includes means for electrically coupling to the first active contact including means for isolating the electrical coupling means from the gate. The coupling means may be the via 2000 shown in FIG. 21. The device also includes a first via electrically coupled to the gate and landing on the electrical coupling means to electrically couple the electrical coupling means and the first active contact to the gate to ground the gate. In another aspect, the aforementioned means may be any module or any apparatus configured to perform the functions recited by the aforementioned means.

According to a further aspect of the present disclosure, a device having a gate coupled to a neighboring contact in a device active area is described. The device includes a gate and a first active contact adjacent to the gate. The device also includes means for electrically coupling to and at least partially overlapping with the gate and the first active contact. The coupling means is self-aligned with a neighbor stacked contact to electrically isolate the coupling means from the neighbor stacked contact. The means may be extended stacked contact 2300 as shown in FIG. 23. In another aspect, the aforementioned means may be any module or any apparatus configured to perform the functions recited by the aforementioned means.

to a further aspect of the present disclosure, a device having an electrically grounded gate in a device active area is described. In one configuration, the device includes means for electrically coupling a portion of the first stacked contact to the first gate contact while remaining electrically isolated from other portions of the first stacked contact. The means may be the via 2000 shown in FIG. 21. In another aspect, the aforementioned means may be any module or any apparatus configured to perform the functions recited by the aforementioned means.

According to a further aspect of the present disclosure, a device having a gate coupled to a neighboring contact in a device active area is described. The device includes means self-aligned to the first contact and self-isolated within the means for at least partially overlapping selected portions of the second contact and selected portions of the first contact. The means may be extended stacked contact 2300 as shown in FIG. 23. In another aspect, the aforementioned means may be any module or any apparatus configured to perform the functions recited by the aforementioned means.

Figure 25:
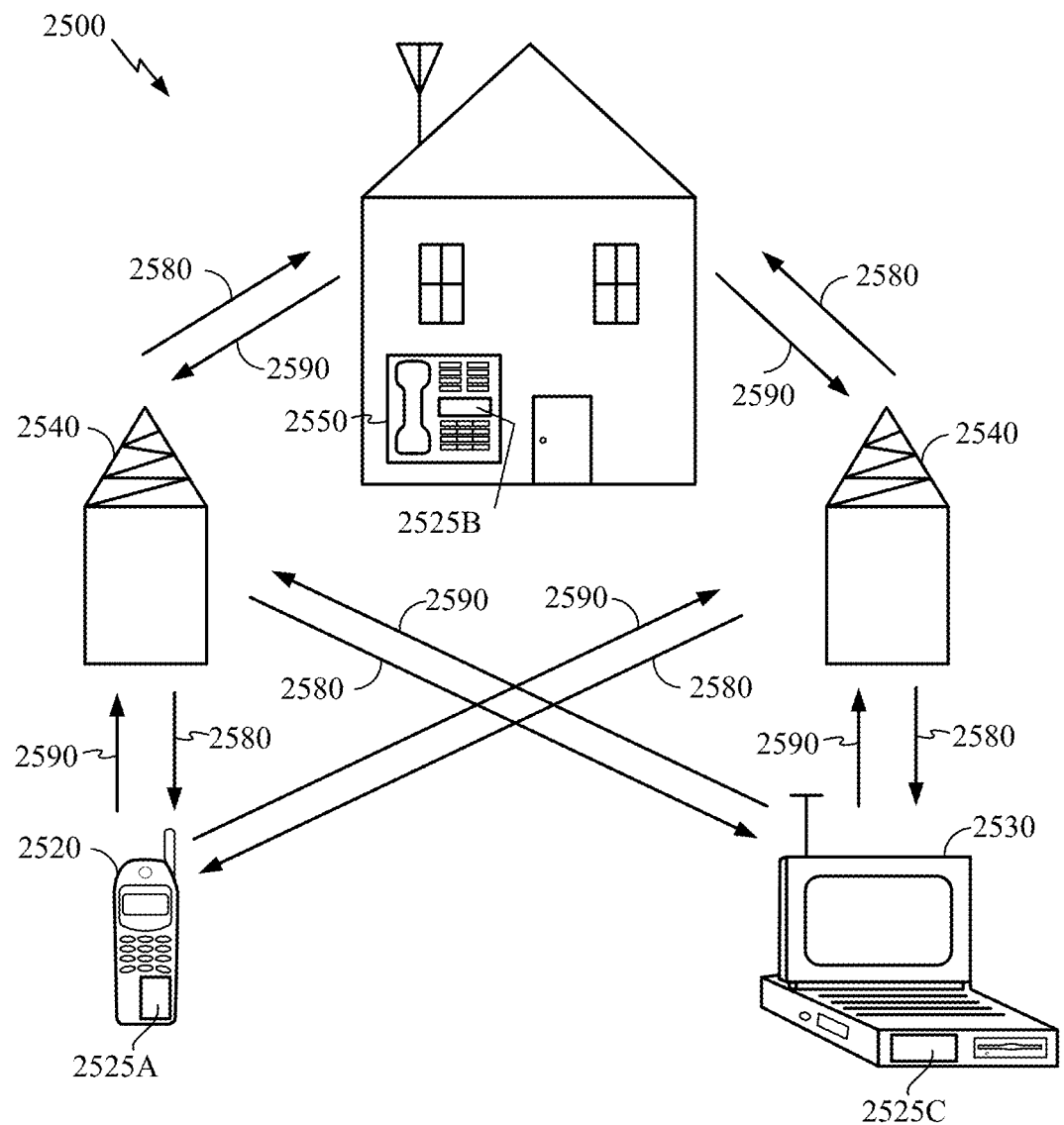
FIG. 25 is a block diagram showing an exemplary wireless communication system in which a configuration of the disclosure may be advantageously employed.

FIG. 25 is a block diagram showing an exemplary wireless communication system 2500 in which an aspect of the disclosure may be advantageously employed. For purposes of illustration, FIG. 25 shows three remote units 2520, 2530, and 2550 and two base stations 2540. It will be recognized that wireless communication systems may have many more remote units and base stations. Remote units 2520, 2530, and 2550 include IC devices 2525A, 2525C, and 2525B that include the disclosed devices. It will be recognized that other devices may also include the disclosed devices, such as the base stations, switching devices, and network equipment. FIG. 25 shows forward link signals 2580 from the base station 2540 to the remote units 2520, 2530, and 2550 and reverse link signals 2590 from the remote units 2520, 2530, and 2550 to base stations 2540.

In FIG. 25, remote unit 2520 is shown as a mobile telephone, remote unit 2530 is shown as a portable computer, and remote unit 2550 is shown as a fixed location remote unit in a wireless local loop system. For example, the remote units may be mobile phones, hand-held personal communication systems (PCS) units, portable data units such as personal data assistants, GPS enabled devices, navigation devices, set top boxes, music players, video players, entertainment units, fixed location data units such as meter reading equipment, or other devices that store or retrieve data or computer instructions, or combinations thereof. Although FIG. 25 illustrates remote units according to the aspects of the disclosure, the disclosure is not limited to these exemplary illustrated units. Aspects of the disclosure may be suitably employed in many devices, which include the disclosed devices.

Figure 26:
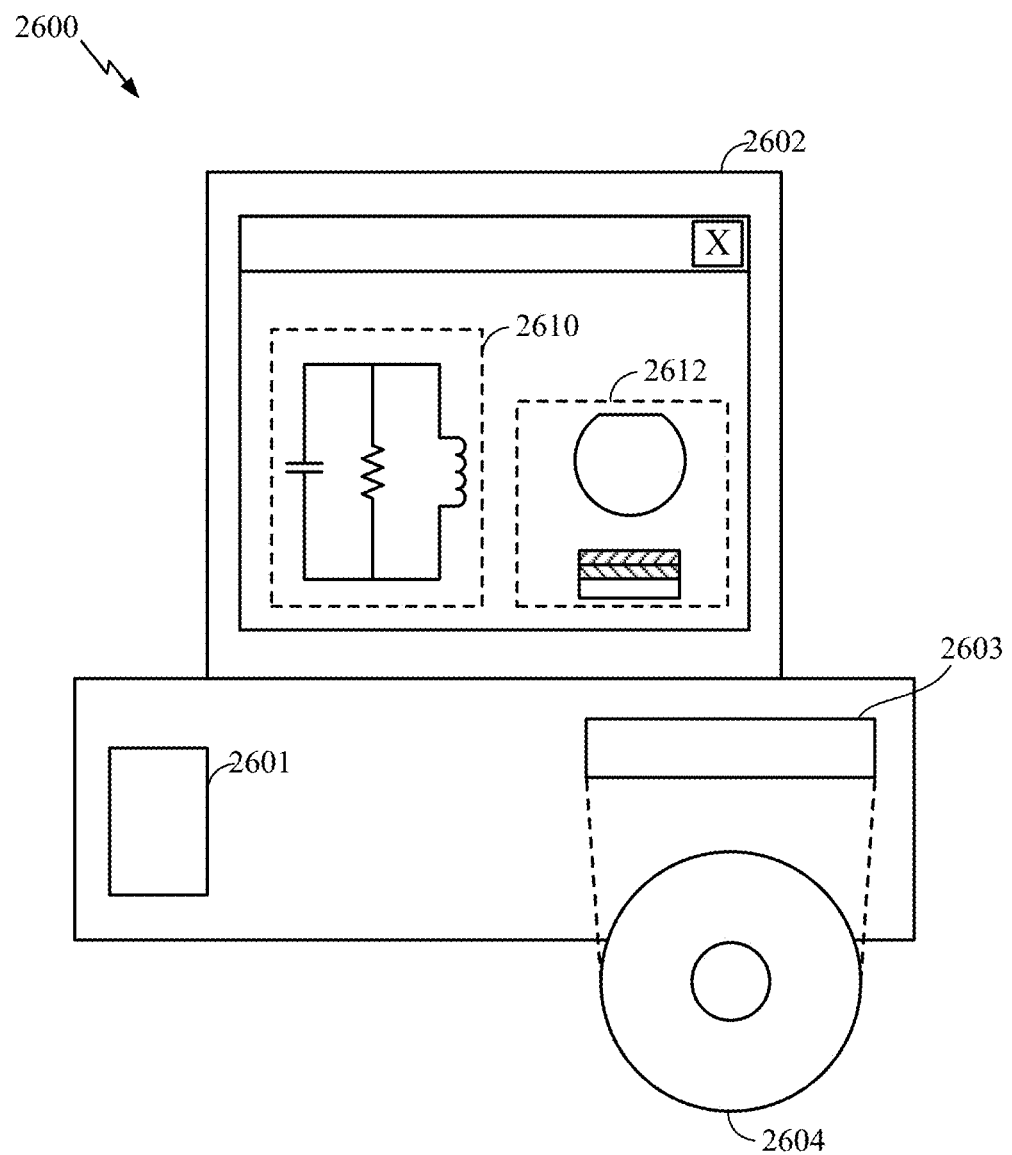
FIG. 26 is a block diagram illustrating a design workstation used for circuit, layout, and logic design of a semiconductor component according to one configuration.

FIG. 26 is a block diagram illustrating a design workstation used for circuit, layout, and logic design of a semiconductor component, such as the devices disclosed above. A design workstation 2600 includes a hard disk 2601 containing operating system software, support files, and design software such as Cadence or OrCAD. The design workstation 2600 also includes a display 2602 to facilitate design of a circuit 2610 or a semiconductor component 2612 such as a device in accordance with an aspect of the present disclosure. A storage medium 2604 is provided for tangibly storing the design of the circuit 2610 or the semiconductor component 2612. The design of the circuit 2610 or the semiconductor component 2612 may be stored on the storage medium 2604 in a file format such as GDSII or GERBER. The storage medium 2604 may be a CD-ROM, DVD, hard disk, flash memory, or other appropriate device. Furthermore, the design workstation 2600 includes a drive apparatus 2603 for accepting input from or writing output to the storage medium 2604.

Data recorded on the storage medium 2604 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 2604 facilitates the design of the circuit 2610 or the semiconductor component 2612 by decreasing the number of processes for designing semiconductor wafers.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

The steps of a method or algorithm described in connection with the disclosure may be embodied directly in hardware, in a software module executed by a processor, or in a combination of the two. A software module may reside in RAM, flash memory, ROM, EPROM, EEPROM, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can include RAM, ROM, EEPROM, CD-ROM or other optical disk storage, magnetic disk storage or other magnetic storage devices, or any other medium that can be used to carry or store specified program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

What is claimed is:

1. A semiconductor device, comprising:
   a dummy gate in a semiconductor device active area;
   a first active contact adjacent to the dummy gate;
   a first stacked contact electrically coupled to the first active contact and including a first isolation layer on sidewalls electrically isolating the first stacked contact from the dummy gate and a cap layer on a surface of the first stacked contact opposite the first active contact; and
   a first via electrically coupled to the dummy gate and landing directly on the surface of the first stacked contact through a portion of the cap layer and directly contacting the first isolating layer on a sidewall of the first stacked contact, the first via arranged to electrically couple the first stacked contact and the first active contact to the dummy gate to ground the dummy gate.

2. The device of claim 1, further comprising:
   a gate contact directly coupled between the dummy gate and the first via, the gate contact having a second isolation layer on sidewalls, the gate contact being self-aligned to the first active contact and self-aligned with the first stacked contact.

3. The device of claim 1, further comprising:
   a second active contact adjacent to the dummy gate; and
   a neighbor stacked contact electrically coupled to and aligned with the second active contact and being self-aligned with the first via to electrically isolate the neighbor stacked contact from the first via.

4. The device of claim 2, in which the first via is self-aligned with the gate contact and the first isolation layer on sidewalls of the first stacked contact is arranged to at least partially overlap the first active contact, an overlapping portion of the first isolation layer electrically isolating a portion of the first stacked contact from a portion of the first via.

5. The device of claim 1, further comprising:
   an active gate;
   a second active contact adjacent to the active gate;
   a second stacked contact electrically coupled to the second active contact and including a second isolation layer on sidewalls electrically isolating the second stacked contact from the active gate; and
   a second via electrically coupled to the active gate and being self-aligned with the second stacked contact.

6. The device of claim 1 integrated into a mobile phone, a set top box, a music player, a video player, an entertainment unit, a navigation device, a computer, a hand-held personal communication systems (PCS) unit, a portable data unit, and/or a fixed location data unit.

7. A semiconductor device, comprising:
   a dummy gate in a semiconductor device active area;
   a first active contact adjacent to the dummy gate; and
   an extended stacked contact directly electrically coupled to a gate contact of the dummy gate and the first active contact, and directly contacting a portion of an isolation layer between the gate contact and the first active contact, the extended stacked contact arranged to ground the dummy gate by at least partially overlapping both the dummy gate and the first active contact, the extended stacked contact being self-aligned with a neighbor stacked contact to electrically isolate the extended stacked contact from the neighbor stacked contact.

8. The device of claim 7, further comprising:
   an active gate;
   a second active contact adjacent to the active gate;
   a second stacked contact electrically coupled to the second active contact and including a second isolation layer on sidewalls electrically isolating the second stacked contact from the active gate; and
   a via electrically coupled to the active gate and being self-aligned with the second stacked contact.

9. The device of claim 7, integrated into a mobile phone, a set top box, a music player, a video player, an entertainment unit, a navigation device, a computer, a hand-held personal communication systems (PCS) unit, a portable data unit, and/or a fixed location data unit.

10. A semiconductor device, comprising:
   a dummy gate in a semiconductor device active area;
   a first active contact adjacent to the dummy gate;
   first means for electrically coupling to the first active contact including a first means for isolating the first electrical coupling means from the dummy gate and a cap layer on a surface of the first electrical coupling means opposite the first active contact; and
   a first via electrically coupled to the dummy gate and landing directly on the surface of the first electrical coupling means through a portion of the cap layer and directly contacting the first means for isolating on a sidewall of the first electrical coupling means, the first via arranged to electrically couple the first electrical coupling means and the first active contact to the dummy gate to ground the dummy gate.

11. The device of claim 10, further comprising:
   a gate contact directly coupled between the dummy gate and the first via, the gate contact having a second means for isolating on sidewalls, the gate contact being self-aligned to the first active contact and self-aligned with the electrical coupling means.

12. The device of claim 11, further comprising:
   a second active contact adjacent to the dummy gate; and
   a neighbor electrical coupling means electrically coupled to and aligned with the second active contact and being self-aligned with the first via to electrically isolate the neighbor electrical coupling means from the first via.

13. The device of claim 11, in which the first via is self-aligned with the gate contact and the first isolating means of the electrical coupling means is arranged to at least partially overlap the first active contact, an overlapping portion of the first isolating means electrically isolating a portion of the electrical coupling means from a portion of the first via.

14. The device of claim 10, further comprising:
   an active gate;
   a second active contact adjacent to the active gate;
   second means for electrically coupling to the second active contact and including a third means for isolating the second electrical coupling means from the active gate; and
   a second via electrically coupled to the active gate and being self-aligned with the second electrical coupling means.

15. The device of claim 10 integrated into a mobile phone, a set top box, a music player, a video player, an entertainment unit, a navigation device, a computer, a hand-held personal communication systems (PCS) unit, a portable data unit, and/or a fixed location data unit.

\* \* \* \* \*